Jan. 12, 1971 R. R. GEISLER 3,554,877

METHOD OF MAKING PRINTED CIRCUIT ASSEMBLIES

Filed Feb. 7, 1968

INVENTOR,
ROBERT R. GEISLER.
BY Milton M. Davis,
Harry M. Saragovitz,
Edward J. Kelly & Herbert Berl
ATTORNEY United States Patent Office 3,554,877
Patented Jan. 12, 1971

3,554,877
METHOD OF MAKING PRINTED CIRCUIT ASSEMBLIES

Robert R. Geisler, Keansburg, N.J., assignor to the United States of America as represented by the Secretary of the Army Filed Feb. 7, 1968, Ser. No. 703,730
Int. Cl. B32b *31/14;* C23b *5/48*
U.S. Cl. 204—15 2 Claims

ABSTRACT OF THE DISCLOSURE

The invention herein is concerned with a method of making double-sided or multilayer printed circuit boards with hole-free terminal leads on one surface of the board for attachment of wire leads while providing electrical interconnection between conductive layers.

The invention described herein may be manufactured, used, or licensed by or for the Government for governmental purposes without the payment to me of any royalty thereon.

BACKGROUND OF THE INVENTION

This invention relates generally to the interconnection of printed circuit cards and more specifically to a method for electrically and mechanically interconnecting a plurality of superimposed printed circuit cards.

Printed circuit cards are well known in the art and extensively used in the electronics industry. Recent trends in this industry toward miniaturization of electronic devices have resulted in a variety of printed circuit packaging methods for arranging a compact circuit assembly. Since modern complex electronic equipments require unitized construction permitting use in assembly and maintenance, modern packaging concepts emphasize modular construction, and these concepts have been extended to include printed circuit assemblies. For example, in one approach, the printed circuit card is reduced in size and several cards are assembled in stacked or superimposed relation. In such method, the problem arose of electrically interconnecting the cards. One widely used prior art technique provides a multiplanar printed circuit consisting of stack of insulative sheets having desired conductor configurations adhered thereto and having continuously plated throughholes, which electrically interconnect the conductor configurations existing at the various planes of the composite board. These holes result in minimal terminal land area on the surface of the board for attachment of electronic component leads.

SUMMARY OF THE INVENTION

Accordingly the primary object of the present invention is to provide a method of making printed circuit assembles which make possible a hole-free terminal land which provides more available surface area for welding, soldering or otherwise attaching electronic parts leads with improved reliability.

It is also an object of the invention to provide a printed circuit multilayer assembly wherein the circuit layers are firmly secured relative to each other without end or side supporting devices.

The objectives and features of the invention herein are accomplished by the novel method of making printed circuit assemblies which comprises essentially the following steps: First preparing individual layers containing the preferred wiring diagrams by conventional photo-lithographic method; inserting adhesive epoxy between the individual layers to form a solid sheet; drilling holes through the assembled layers at predetermined locations; applying to the top surface of the circuit board successive layers of B stage adhesive; a metal foil and etchant resist; and etchant resist alone to the bottom surface; etching the interior of the holes to a predetermined depth to leave exposed terminal lands; chemically depositing metal to all exposed surfaces of the assembly; removing all the etchant resist by appropriate solvents and finally electroplating with a suitable metal all the exposed metal surfaces.

DESCRIPTION OF THE PREFERRED EMBODIMENT

Figure 1:
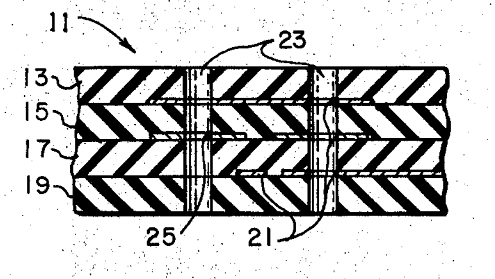
FIGS. 1–6 show the various steps illustrative of the method of the present invention.
Figure 5:
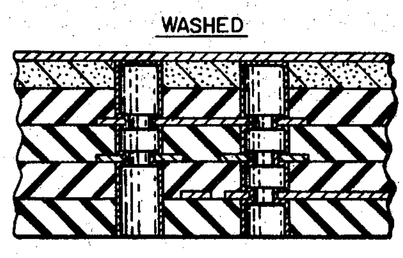
Figure 2:
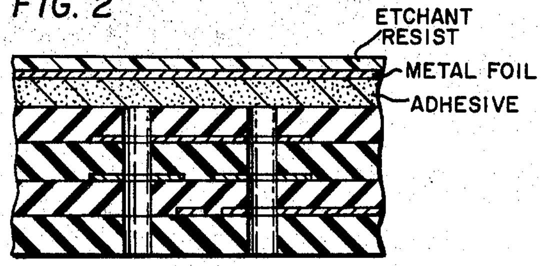
Figure 3:
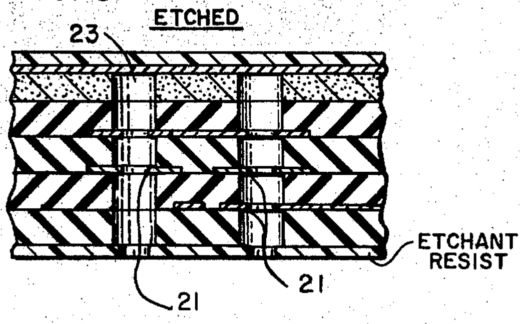
Figure 4:
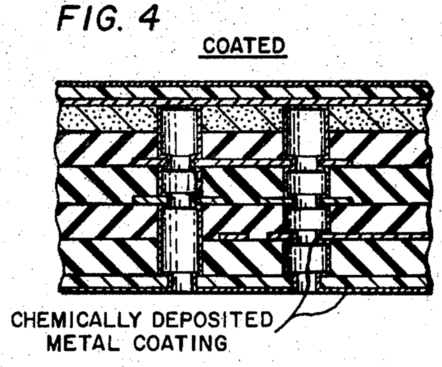

With reference to the drawing, in FIG. 1 there is shown a portion of a multilayer printed circuit board 11 comprised of laminated insulating layers or panels 13, 15, 17 and 19. Disposed between the panels are circuit conductors, several of which are designated 21. As shown in FIG. 1 a plurality of holes 23 are drilled through the board 11 at predetermined points. Such drilled holes will expose spots of the circuit conductors to form terminal lands, one of which is shown at 25. There is then applied to the top surface of the laminated circuit board 11 a layer of B stage adhesive and metal foil, both of which can be applied by conventional laminating techniques as shown in FIG. 2. An etchant resist is then applied to the exposed surface of the metal foil as is portrayed in the same FIG. 2. To the interiors of the holes 23 there is then applied an etchant until at least a portion of the epoxy is etched away to expose a portion of the circuit conductors 21 as shown in FIG. 3. This same figure (FIG. 3) also shows the step of applying etchant resist to the underside of the circuit board. FIG. 4 shows the step in the method whereby metal coatings are deposited, by available chemical techniques, within the holes and over all the exposed etchant resist surfaces. Such metallic deposition operation electrically interconnects all the internal terminal lands 25 with the metal foil on the surface of the multilayer board 11. The next step in the method, as shown in FIG. 5, is the removal of all etchant resists which are dissolved in appropriate solutions. It is to be noted that in such step there is also removal of the chemically deposited metal on the surface of the resist at both the top and bottom surfaces of printed circuit board 11.

Figure 6:
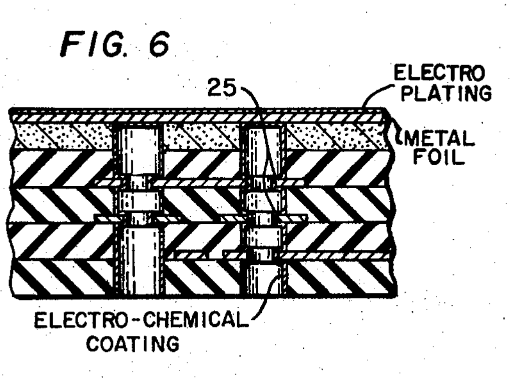

The final step in the method is represented in FIG. 6 which sets forth the step of electroplating all the exposed metal surface to provide increased strength, improved conductivity, improved solderability, etc. The metal foil is then etched by standard processes to obtain the desired conductive pattern.

While there has been described what is at present considered to be the preferred embodiment of this invention, it will be obvious to those skilled in the art that various changes and modifications may be made therein without departing from the invention, and it is therefore aimed in the appended claims to cover all such changes and modifications as fall within the true spirit and scope of the invention.

What is claimed is:

1. The method of making a multiplanar printed circuit board comprising the steps of;

(a) forming a composite board from a stack of insulative sheets having desired conductor configurations on the surfaces thereof which are interior in the composite board, said composite board having holes drilled therethrough at predetermined locations;

(b) applying to the top surface of the composite board successive layers of an adhesive, a metal foil and an etchant resist, and simultaneously an etchant resist alone to the bottom surface of the board;

(c) etching the interior of the holes to a predetermined depth to leave exposed terminal lands;

(d) depositing metal chemically to all exposed surfaces of the composite board and to the walls of said holes; and (e) removing all the etchant resist and the metal coatings thereon.

2. The method of claim 1 and further including the step of electroplating the composite board after the said last step.

References Cited

UNITED STATES PATENTS

| | | | |
|---|---|---|---|
| 3,264,402 | 8/1966 | Shaheen et al. | 156—3 |
| 3,276,106 | 10/1966 | Bester et al. | 204—15 |
| 3,311,966 | 4/1967 | Shaheen et al. | 156—3 |
| 3,319,317 | 5/1967 | Roche et al. | 204—15 |
| 3,335,489 | 8/1967 | Grant | 156—7 |

JOHN H. MACK, Primary Examiner

T. TUFARIELLO, Assistant Examiner

U.S. Cl. X.R.

156—3